US00RE34197E

United States Patent [19]

Engel

[11] E Patent Number: Re. 34,197

[45] Reissued Date of Patent: Mar. 16, 1993

[54] COMPUTER CONTROLLER VISCOUS MATERIAL DEPOSITION APPARATUS

[76] Inventor: Harold J. Engel, 18932 Olympia St., Northridge, Calif. 91326

[21] Appl. No.: 725,651

[22] Filed: Jul. 3, 1991

Related U.S. Patent Documents

Reissue of:

[64] Patent No.: 4,941,428
Issued: Jul. 17, 1990
Appl. No.: 303,077
Filed: Jan. 30, 1989

U.S. Applications:

[63] Continuation of Ser. No. 75,571, Jul. 20, 1987, abandoned.

[51] Int. Cl.[5] ..... B05C 5/02

[52] U.S. Cl. ..... 118/680; 118/401; 118/697; 118/708; 346/140 R

[58] Field of Search ..... 118/401, 411, 680, 681, 118/696, 697, 708; 346/140 R

[56] References Cited

U.S. PATENT DOCUMENTS

| | | | |
|---|---|---|---|
| 2,548,456 | 4/1951 | Wells | 118/710 |
| 3,731,648 | 5/1973 | Gerber et al. | 118/697 |
| 3,933,187 | 1/1976 | Marlinski | 118/401 X |
| 4,291,642 | 9/1981 | Kolc | 118/680 X |
| 4,408,907 | 10/1983 | Bernardis | 101/93.05 X |
| 4,572,103 | 2/1986 | Engel | 118/697 |
| 4,584,964 | 4/1986 | Engel | 118/696 X |

*Primary Examiner*—Richard L. Chiesa
*Attorney, Agent, or Firm*—Thomas F. Smegal, Jr.; Mark B. Mondry

[57] ABSTRACT

A device for uniform and discretely controlled deposition of small quantities of viscous material at each of a succession of locations on a surface according to a digital X-Y-Z program. A particular application is for deposition of a viscous solder flux or slurry of very small solder particles in such a flux material, through a small (needle) orifice. A pumping valve is driven, typically by pneumatic pressure, during the brief dwell time of the needle at each programmed X, Y location, on an electronic circuit board or the like. A mechanical contact member is provided for automatically optimizing the needle orifice height (Z dimension) over each programmed location irrespective of irregularities or curvature of the plane of the circuit board. In an optional embodiment spaced needle orifices provide contemporaneous deposition of the viscous material.

10 Claims, 3 Drawing Sheets

FIG. 2
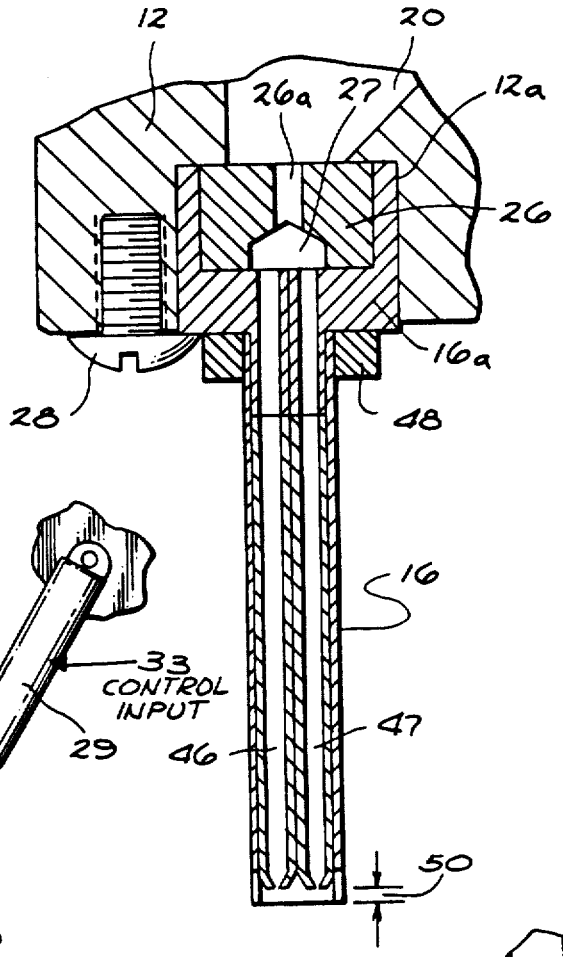
FIG. 3
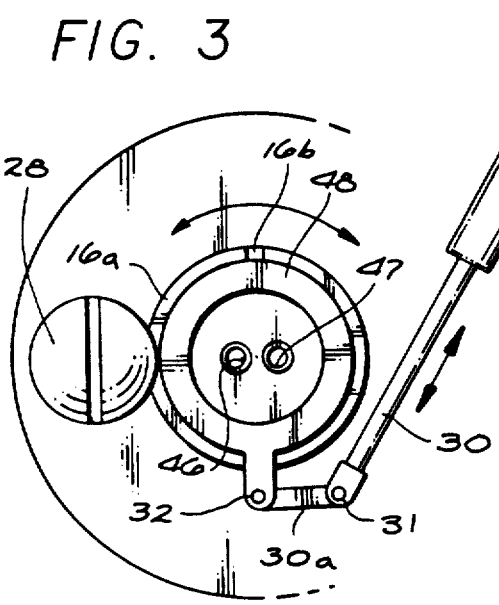
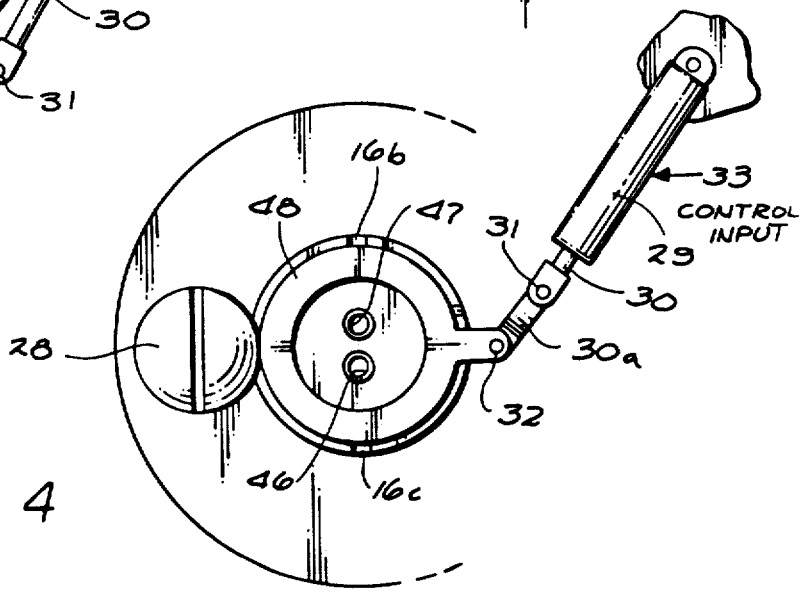
FIG. 4

COMPUTER CONTROLLER VISCOUS MATERIAL DEPOSITION APPARATUS

Matter enclosed in heavy brackets [ ] appears in the original patent but forms no part of this reissue specification; matter printed in italics indicates the additions made by reissue.

This is a continuation of co-pending application Ser. No. 07/075,571 filed on July 20, 1987, now abandoned.

BACKGROUND OF THE INVENTION (1) Field Of The Invention

The invention relates generally to devices and systems for discrete computer controlled small-quantity deposition of viscous a material at a succession of X Y locations on a surface. More specifically, the invention relates to such devices with additional apparatus for discrete control of the height of the dispensing needle orifice (or orifices) over the surface irrespective of surface height variations, and for discrete orientation of multiple needle orifices in the plane of the surface at each X Y location.

(2) Description of The Prior Art

In the prior art, systems of the general computer positioning type are known and have been used to deposit small quantities of viscous material such as solder flux, a slurry of such flux with solder particles or a solder masking material according to a computer directed program successively positioning a needle orifice over each preselected location on a surface such as an electronic printed circuit board. Two particularly pertinent devices and systems are disclosed in U.S. Pat. Nos. 4,584,964 and 4,572,103. Both of these patents have the same inventorship and ownership as this application and the inventive subject matter described herein.

U.S. Pat. No. 4,584,964 describes a system of the computer controlled type which employs a controlled valve for passing a predetermined quantity of the viscous material to be deposited at each discrete location on the surface over which its needle orifice is successively positioned. That disclosure particularly includes novel means for drawback (anti-drip) from the needle orifice. However, it does not address the problem of vertical needle orifice positioning over a less than completely regular and planar surface. The needle orifice height (Z coordinate) is uniformly programmed to a valve which is only optimum if the surface is flat and extremely smooth. Since devices of this type deposit very small quantities at each discrete location, optimization of Z coordinate is important and cannot be programmed along with the successive X and Y coordinates, because each circuit board or other surface is likely to contain its own unique variation, warp or distortions.

In the device of U.S. Pat. No. 4,572,103 the deposition of the viscous material is via a pumping valve (force piston thrusting within a cylinder). This configuration is better adapted to the handling of solder particle slurry materials than is the controlled valve version of U.S. Pat. No. 4,584,964 because of the relatively large effective pressure applied to the needle by the force piston. That pressure does not affect the apparatus "upstream" from the force piston cylinder.

Systems of the prior art, including those described in the referenced U.S. patents find their greatest application in production set-ups where a number of circuit board units of the same configuration are being prepared for solder application by flow soldering or other known techniques. The computerized flux or slurry deposition is very rapidly accomplished. The economics of manufacture of such circuit boards demands that costs be minimized and that fabrication be performed by relatively low skill operators and automatic equipment.

The aforemention U.S. patents discuss other prior art extant in this general art, such as U.S. Pat. Nos. 3,731,648 and 3,785,898 which show the general type of computerized X, Y and Z axis positioning which is an element of the combination of this invention as well as of the systems of U.S. Pat. Nos. 4,584,964 and 4,572,103 discussed hereinbefore.

None of the known systems of the type described provides a solution to the problem of circuit board warp and surface Z axis perturbations. Moreover, since the deposition of a single bead or cone of viscous material at a time is contemplated by the known apparatus, there is room for improvement and corresponding production time reduction.

The invention herein described deals in unique ways with both the circuit board variations and need for increased speed of operation in accordance with unique advancements in this art which will be described as this specification proceeds.

SUMMARY OF THE INVENTION

In consideration of the state of the prior art as aforesaid, it may be said to have been the general object of the invention to provide Z axis position modification to account for circuit board warp or surface variations in a system of the character described, and also to provide means for contemporaneous deposition at more than one location and to provide programmed rotational orientation of the plural needle elements effecting said contemporaneous depositions in a plane generally parallel to the plane of the said circuit board. The Z axis in this sense is usually vertical, but this is not necessarily true.

The disclosures of U.S. Pat. Nos. 4,584,964 and 4,572,103 (having common ownership vis-a-vis this application) are hereby incorporated by reference into this disclosure to provide understanding of other details not herein repeated and to provide a fuller understanding of the utility of the invention.

Basically, the invention includes two major aspects. One aspect relates to the modification of the Z axis control of the needle element carriage to account for curvature and surface variations on a circuit board to which the flux, slurry or solder masking material is being applied. A mechanical contact member is arranged to contact the board surface as a finder to establish the optimum needle orifice clearance at the board surface for each X Y position of the carriage mounting the needle or needles. The Z axis fixed programming for each dwell time over a corresponding X Y position on the board at which a fluid deposition is to occur is theoretically constant over the board surface provided the board is perfectly flat and there are no surface variations. However, in practice, this is never completely true, and one board of a series may have different variations vis-a-vis other boards to be processed. Relatively minor variations are important because the optimum elevation (Z axis clearance) of the needle orifice or orifices may be as little as 0.010 inches.

To achieve modification of the Z axis programmed positioning to provide optimum Z axis clearance irrespective of the aforementioned variations of board characteristics, the preprogrammed Z axis clearance may be overstated, i.e. may call for too small a clearance value. A mechanical contact member affixed to the needle element carriage contacts the board surface at optimum clearance and a contact force sensor generates a signal supplied to the X, Y, Z programmer to adjust the Z axis clearance to a value resulting in minimal contact force of the contact member against the board. The preferred form of this mechanical member is that of a hollow tube through which the needle or needles extend with their orifice ends recessed from the tube extremity by the aforementioned optimum Z axis clearance. Thus the Z axis clearance is adjusted from the pre-programmed value at each X Y location.

Another important aspect of the invention relates to the plural needle (usually two needles) configuration whereby two (or more) depositions are applied contemporaneously. This arrangement affords a reduction in the time for processing of a circuit board where inherent circuit board symmetry permits. In view of the quest for production efficiency, circuit boards may be designed such that a number of solder points are located in close spaced relationship either along the X axis or the Y axis of the board or at some angle in between. Still further, the solder points for certain components may be about a small circular pattern. Accordingly, the invention provides rotation of the needle pair to accomodate those situations to deposit the flux or slurry corresponding thereto.

It will be realized that more than two needles could be employed within the sleeve contact member if, for example, a number of points about a relatively tight circle were extant.

The details of structure and systems for effecting the aforementioned major aspects, and other aspects which will be evident as this specification proceeds, will be explained hereinafter.

BRIEF DESCRIPTION OF THE DRAWINGS

FIG. 2 is a sectioned view of a dual needle arrangement within a hollow sleeve board contact member;

FIG. 3 is a bottom view of the structure of FIG. 2 with the dual needle orifices oriented in a first mode;

FIG. 4 is a bottom view of the FIG. 2 structure with the dual needle orifices orthogonally oriented vis-a-vis the showing of FIG. 3.

DETAILED DESCRIPTION

Figure 1:
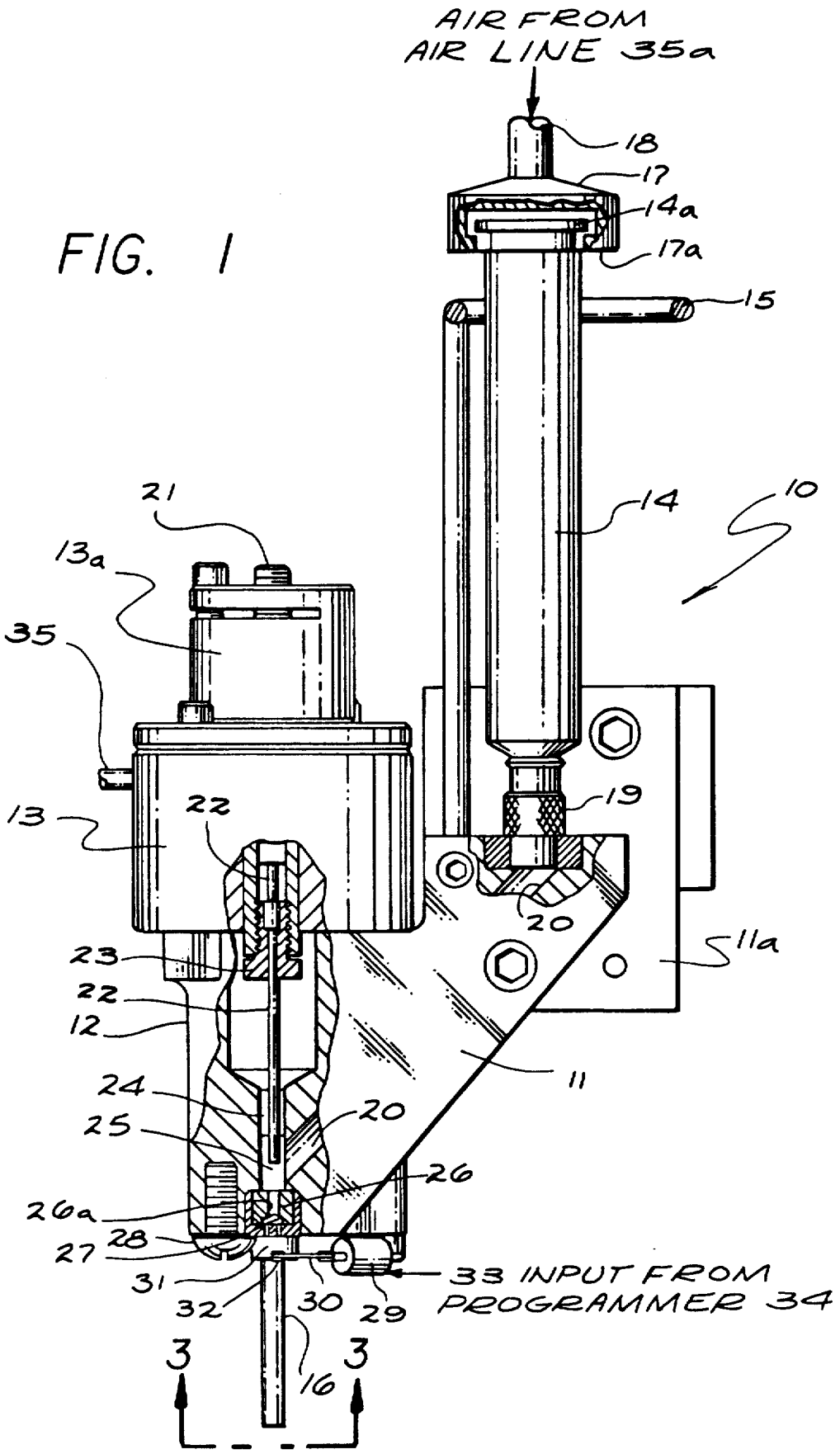
FIG. 1 is a partially cut-away view of the basic apparatus according to the invention.

Referring to FIG. 1, the viscous fluid dispensing structure is shown in partial cut-away form. This structure 10 is referred to herein as the dispenser head or carriage for convenience. It is carried and positioned by a digitally controlled programmed X, Y, Z electromechanical locator (plotter) such as shown and described in U.S. Pat. No. 4,584,964, the disclosure of which has been incorporated herein by reference.

The structural parts 11 and 11a support a pump 12, an air (electric or hydraulic) piston actuator 13, and a syringe 14. An optional syringe brace 15 is shown affixed to the structural member 11. Structural parts in turn are attached to the positionable member of the aforementioned electro-mechanical locator such that the needle and mechanical contact member assembly is successively positioned directly above each location at which a deposit of flux or slurry is required.

Looking ahead to FIG. 5, this schematic block diagram will be explained and related with FIG. 1, 3 and 4 for clarity. Within the control system of FIG. 5, a conventional compressed air supply 37 provides moderately pressurized air (5 to 10 psi, for example). This basic air supply is available in steady form via lead 38 through electro-pneumatic controller unit 42 and thence via lead 35 through dispenser positioning unit 43 and thence into the syringe 14 (FIG. 1) at port 18. The steady air pressure thereat urges an O-ring sealed free piston (not shown in FIG. 1) downward within the body of syringe 14 against the fluid supply therein. Thus syringe 14 operates as a pressurized reservoir.

The viscous, fluid within syringe 14 is continually urged down into passage 20 and thence into the pre-dispense chamber 25. Lock fitting 19 joins the body of syringe 14 to the passage 20 within structural block 11.

The viscous fluid thus driven into the pre-dispense chamber 25 does not significantly travel down the bore 26a in bushing 26 because of its viscosity and the relatively low air pressure into port 18. The downward stroke of rod piston 22 pushes the fluid ahead of itself through bore 26a. The maximum downward travel of piston 22 may, for example, be down to the top of the plenum chamber 27. The chamber 27 is shown as it would be for a two needle dispensing configuration. However, for the single needle plenum chamber 27 could be much smaller, or could be merely an extension of bore 26a as will be appreciated from FIG. 1.

The rod piston 22 is guided accurately by bushings 23 and 24 so that it slides smoothly into bore 26a. The air operated piston connected within air piston actuator 13 to adjustment screw 21 at upper extension 13a receives only the relatively low air supply pressure, but because of the ratio of the reaction piston diameter within air piston actuator 13 to the very small diameter of rod piston 22, the effective pressure applied to the viscous fluid within bore 26a is high, on the order of 5,000 to 10,000 psi, for example. The air piston actuator 13 may have a pancake type piston arrangement according to a known form.

Although the air cylinder (piston actuator) 13 is assumed to be pneumatically operated, it will be obvious to those of skill in this art that it could be of an appropriately configured hydraulic or electric solenoid type thrust actuator.

The apparatus of FIG. 1 is all within the dispenser head (carriage) 10, some air and electrical lines are fed through intermediate units because of mechanical considerations between moving and stationary elements. An example of this is the air pulse on air inlet 35 defining the dwell time at each location on the board surface. This pulse comes from the stationary electropneumatic controller 42 (which is essentially a solenoid operated air switch) and the steady air supply 37.

The syringe 14 is shown with a cap 17 having radially inwardly extending projections 17a over a fraction of the circumference of cap 17 to engage outwardly extending projection 14a over a portion of the upper lip of the body of syringe 14 in the familiar twist-cap configuration. Obviously, a threaded engagement or other form of attachment within the knowledge of persons of skill in this art could be used as well. Port previously identified, receives the low but steady air pressure from air line 35a (see FIG. 5). Disengagement of cap 17 facilitates reloading of syringe 14 with fluid after the free piston within has been withdrawn vertically. To facilitate this, a threaded bore (not shown) axially part way through the upper end of this piston may be provided for inserting a threaded dowel therein as an extracting tool. Referring now to FIG. 2, a much enlarged view upward as indicated on FIG. 1 is shown. It is to be understood that, although a dual needle arrangement is depicted in FIG. 2, 3 and 4 and assumed in FIG. 1 and 5, a single needle configuration could be employed if appropriate. In that alternative, the hollow sleeve mechanical contact member 16 and the single needle may be coaxial. In the single needle form, the retaining screw 28 can be drawn in tightly, since the cup 16a, which is integral with the hollow sleeve mechanical contact member 16, need not be rotatable within the bore 12a in the structural body 12 as it is required to be in the dual needle version.

Reverting to the description of the dual needle embodiment, it will be noted that FIG. 2 depicts two needles 46 and 47 fed from the plenum 27. The guide bushing 26 is a separate part but is press fitted into cup 16a. This is a convenience of manufacture to permit machining the plenum 27 before guide bushing 26 is fitted into cup 16a. A shoulder of cup 16a will be seen to be axially engaged by the head of screw 28, but with enough axial looseness to permit rotation, of up to 90 degrees, of the entire assembly of hollow sleeve contact member 16 and cup 16a. Rotation is effected by an axial throw air cylinder 29, shown in FIG. 1, 3 and 4, but not FIG. 2. Such an arrangement is fast acting and capable of effecting the positioning of needles 46 and 47 between that of FIG. 3 and FIG. 4 or at any required orientation therebetween. FIG. 3 depicts an extension of connecting rod 30 and FIG. 4 shows the retraction of connecting rod 30 consistent with the corresponding orientations of needles 46 and 47. The connections of rod 30 via a conventional pin 31, linkage 30a, and pin 32 to control ring 48 (which is affixed to hollow sleeve 16) will be obvious.

Figure 5:
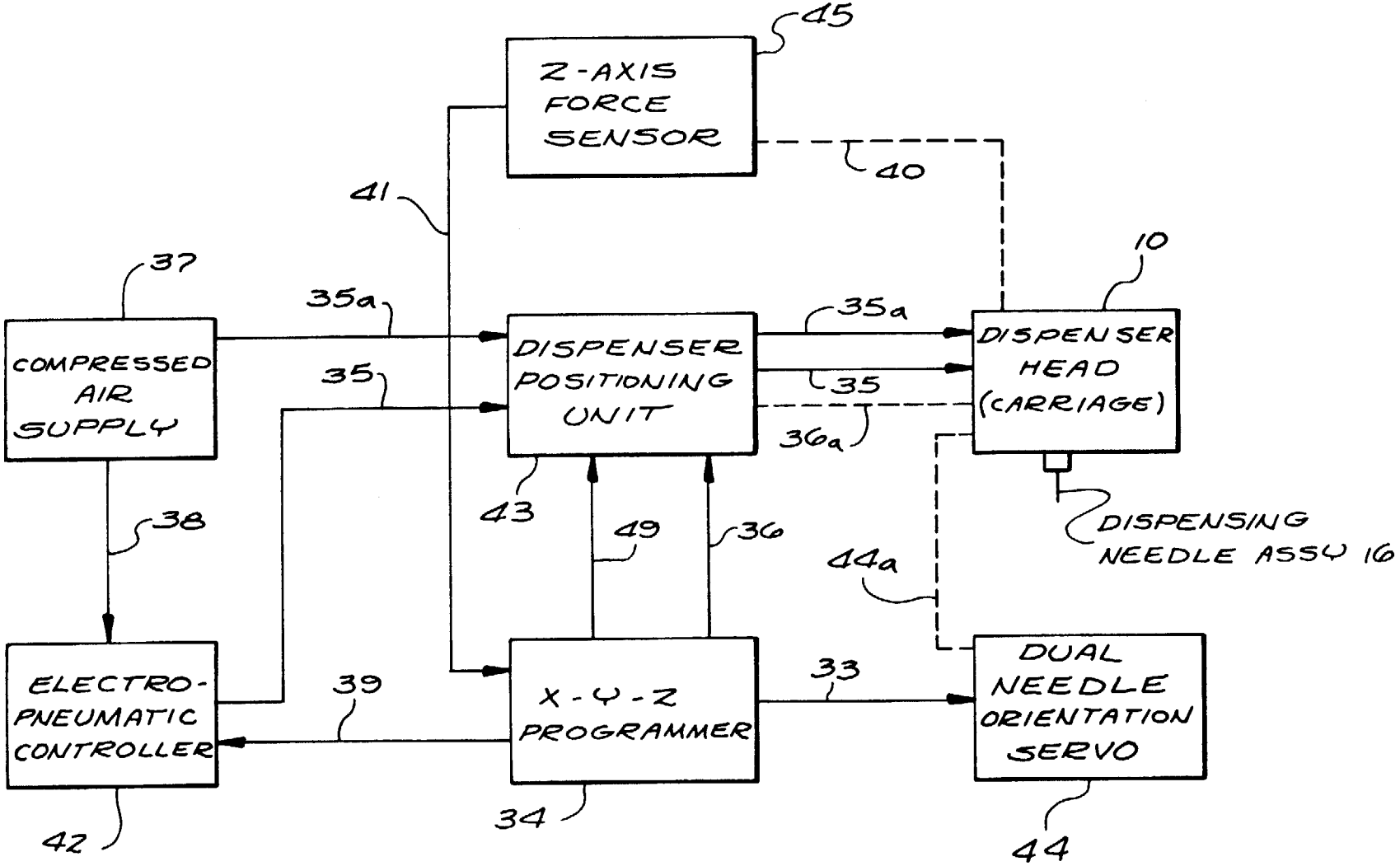
FIG. 5 is a schematic block diagram of the control system according to the invention.

Referring now to FIG. 5, the description thereof continues with functional comments included.

Basically the X-Y-Z programmer 34 and dispensing positioning unit 43 may be identical to those recognized to be prior art-per se, and as indentified in U.S. Pat. No. 4,584,964 which has been incorporated into this disclosure by reference. The compressed air supply 37 is provided to the dispensing head (carriage) 10 via lead 35a at port 18 of the syringe 14 of FIG. 1 and via lead 38 to electro-pneumatic controller 42 which in turn is controlled from programmer 34 via lead 39 to open and transmit an air pulse during the dwell time of dispenser head (carriage) 10 at each location to which the latter is programmed. This air pulse via lead 35 effects the viscous fluid deposition at the aforementioned location as hereinbefore described. Each such location is identified within programmer 34 as to orientation of the needles and is controlled via lead 33 after each fluid deposition (during dispensing head slew to the next X-Y location) to operate the orientation servo 44 for any required change of needle pair angular orientation. This function is readily added to the programmed data stored in programmer 34. The dashed lead 44a represents the mechanical linkages described with respect to the operation of cylinder 29.

The lead 36 conveys programmed commands for X-Y positioning and lead 49 represents Z axis positioning commands as modified for the optimized Z axis needle positioning. This function provides the Z axis position modification previously said to be required because of curvature and surface irregularities of circuit boards to be processed by the apparatus of the invention. Mechanical linkage 36a represents all X-Y-Z positioning commands to dispensing head 10 as modified in respect to the Z axis.

An alternative Z axis positioning concept involves a simple spring, (not illustrated). For example, a coil spring coaxially arranged externally over the hollow sleeve 16 could be employed to limit the force of the end of the sleeve 16 againsts the circuit board if the dispenser positioning unit 43 (FIG. 5) were arranged to apply only a limited predetermined maximum Z axis downward force. The reaction of this spring could then equal that Z axis force during the dwell time while sleeve 16 and this spring contact the circuit board. Such an arrangement is not, however, as accurate and definitive of Z axis positioning as contemplated in the hereinbefore description.

It will be realized that the more or less standard Z axis pre-programmed positioning could be eliminated and reliance placed on Z axis positioning of the end of sleeve 16 as a result of Z axis force sensing by sensor 45 (FIG. 5) to establish the contact force without modification of a pre-programmed Z axis signal during each dwell time. The three axis pre-programmed positioner is, however, a standard prior art device per se, as identified hereinbefore and modification of the Z axis pre-programmed positioning is, therefore, a desirable design option with the addition of force sensor 45, as described. In that way maximum use of existing electronic assemblies is possible.

Block 45 depicts a compressive force sensor which is preferably associated with the Z axis drive within unit 43. That Z axis drive is conventional as set forth in U.S. Pat. No. 4,584,964 and otherwise in the technical literature. Block 45 may include a force sensor (such as a strain gauge or piezoelectric element or other known force sensor) through which the Z axis positioning is accomplished.

As previously indicated, the programmed unmodified Z axis position for each location may be intentionally overemphasized (such as would position the needle or needles too close to the board surface). The Z axis force sensor 45 is mechanically connected as aforesaid, linkage 40 representing this connection.

The force sensor 45 responds to the reaction force generated as the sleeve 16 touches the board surface, generating a modification signal on lead 41 which overrides the Z axis pre-programmed Z axis signal to effect a minimal contact pressure of sleeve 16 against the board surface. Thus the Z axis net control function operates to insure optimum needle orifice clearance 50 which is built into the needle assembly (see FIG. 2). The Z axis clearance is normally empirically determined to an optimum value. The factors affecting this optimum Z axis clearance include quality of each deposition, fluid viscosity and other factors well known in this art.

The control of a contact or touching force is a well known technique in the robotics art and the detail instrumentation is readily accomplished by the skilled practitioner. The touch force sensing technique is considered to be the preferred form. However, it could also be replaced by a clearance detector, (photoelectric or otherwise). The inventive concept broadly presumes that any instrumentation locating the hollow sleeve 16 bottom end lightly against the circuit board suffices.

Various modifications will suggest themselves to those of skill in this art. Just one such modification could be the substitution of a non-tubular mechanical contact member in lieu of sleeve 16. An important consideration, however, is that the point or points of touch on the circuit board surface be close to the needle orifice or orifices in the horizontal plane for optimum sensing of irregularities. The coaxial nature of hollow sleeve 16 containing the needle or needles 46 and 47 is particularly effective in that respect.

Referring back to FIGS. 3 and 4, it will be realized that, if desired, one of the two needles 46 and 47 could in fact be located at the center of rotation of the needle assembly which includes the elements attached to cup 16a within body 12 (FIG. 2).

It will be noted from FIG. 3 and 4 that slots 16b and 16c, a short distance up from the lower end of tube 16 are provided, preferably to a point just above the orifices of needles 46 and 47, to provide pressure relief for the rapid deposition of the viscous material.

Another variation is readily possible in the apparatus for establishing the needle horizontal place positions, i.e. that shown if FIG. 3 and 4. Such variation would be within ordinary mechanical skill.

Other variations within the spirit of the inventions are of course possible once the inventive concepts are appreciated. Accordingly, it is not intended that the invention be limited other than by the claims hereinafter. The drawings and this description are intended to be typical and illustrative only.

I claim:

1. Apparatus for successive deposition of viscous fluid quantities on a planar surface at each of a corresponding succession of X Y coordinate locations on said surface, said apparatus comprising:

a positionable carriage and a plurality of hollow needle elements mounted on said carriage, each of said needle elements having an orifice directed to deposit said viscous fluid onto said surface from corresponding points of optimum Z axis clearance with respect to said surface, said plural hollow needle elements extending substantially mutually parallel and normal to said surface, said needle elements further being mounted to be rotatable in a plane parallel to said planar surface;

first means for successively positioning said carriage and therefore said needle elements for a corresponding dwell time in a succession of X, Y[, Z] positions with respect to said surface, said first means also including means for rotating said needle elements [for discretely determining the pattern of the corresponding plural depositions of said fluid on said surface] *to a desired orientation* during each of said dwell times.

2. Apparatus according to claim 1 in which said plural needles are arranged to rotate as a unit about a center of rotation.

3. Apparatus set forth in claim 1 in which said first means comprises a digitally controlled programmed positioning device.

4. Apparatus according to claim 1 further comprising second means for effecting optimum location of said orifices in the Z coordinate with respect to said surface, said second means being in the form of a hollow sleeve contact member through which said needle elements pass, said hollow sleeve extending beyond said needle member orifices by an amount substantially equal to said Z optimum axis clearance between said orifice and said surface when said sleeve is in contact with said surface.

5. Apparatus according to claim 4 further comprising a Z axis contact force sensor mounted on said carriage and arranged to detect the force of said sleeve contacting against said surface for modifying a programmed Z axis position control provided by said first means to compensate for variations along said surface [discretely driving each of said dwell times].

6. Apparatus for successive deposition of a viscous fluid quantity at each of a plurality of X-Y coordinate positions on a surface, said apparatus comprising: a carriage carrying at least one hollow needle element having an orifice at a first end thereof facing said surface;

first means for effecting relative motion between said carriage and said surface in the X-Y plane, thereby positioning said needle element for a dwell time at each of a sequence of said X-Y positions;

a pressurized reservoir of said viscous fluid and means covering said quantity of fluid to emit from said needle orifice onto said surface during each of said dwell times;

second means for establishing the Z axis clearance of said orifice with respect to said surface comprising a rigid contact member affixed to said carriage and said at least one needle member, said second means extending downward beyond said needle member orifice by an amount substantially equal to a programmed optimum Z axis clearance between said orifice and said surface when said contact member is in contact with said surface; and third means for controlling the Z axis positioning of said rigid contact member and said needle member as a unit, said third means including Z axis actuation means and means for sensing the force of said rigid contact member against said surface to produce a control signal and apply said signal to said Z axis actuation means to establish the force of said rigid member against said surface during each of said dwell times.

7. Apparatus according to claim 6 in which said rigid contact member is a hollow sleeve and said at least one needle member passes through the hollow interior thereof.

8. Apparatus according to claim 7 in which a single one of said needle members is employed, said hollow sleeve is of substantially circular cross-section and said needle member and said hollow sleeve are substantially concentric.

9. Apparatus according to claim 7 in which said at least one hollow needle element comprises a plurality of needle elements extending mutually parallel through said hollow sleeve.

10. Apparatus set forth in claim 6 further defined in that said at least one needle element is rotatable mounted within said carriage, said at least one hollow needle element comprises a plurality of said hollow needle elements mounted to be rotated as a unit in a plane parallel to the plane said surface; and fourth means comprising a servomechanism responsive to a discrete programmed rotation control signal from said first means to rotate said plural needle elements as a unit in said plane parallel to said surface during each successive one of said dwell times, said rotation being programmed to occur at a time other than when said second means is in contact with said surface; and means within said first means for generating said discrete rotation control signal corresponding to each of said dwell times.

* * * * *